United States Patent [19]

Mirtich et al.

[11] Patent Number: 4,490,229

[45] Date of Patent: Dec. 25, 1984

[54] DEPOSITION OF DIAMONDLIKE CARBON FILMS

[75] Inventors: Michael J. Mirtich, North Olmsted; James S. Sovey, Strongsville; Bruce A. Banks, Olmsted Township, Cuyahoga County, all of Ohio

[73] Assignee: The United States of America as represented by the Administrator of the National Aeronautics and Space Administration, Washington, D.C.

[21] Appl. No.: 628,866

[22] Filed: Jul. 9, 1984

[51] Int. Cl.³ .............................................. C23C 15/00
[52] U.S. Cl. ........................... 204/192 C; 204/192 R; 204/192 SP; 423/414; 423/445; 423/446; 423/449; 423/DIG. 10
[58] Field of Search ......... 204/192 C, 192 R, 192 SP; 423/445, 446, 449, 414, DIG. 10

[56]  References Cited

U.S. PATENT DOCUMENTS

| | | | |
|---|---|---|---|
| 3,859,422 | 1/1975 | Horne et al. | 423/445 |
| 3,949,062 | 4/1976 | Vereschagin | 423/446 |
| 4,060,660 | 11/1977 | Carlson et al. | 428/408 |
| 4,173,522 | 1/1976 | Pulker et al. | 204/192 C |
| 4,191,736 | 3/1980 | Nelson et al. | 423/446 |
| 4,228,142 | 10/1980 | Holcombe et al. | 423/445 |
| 4,288,353 | 9/1981 | Eckel et al. | 260/28 R |
| 4,346,123 | 8/1982 | Kaufmann | 427/38 |
| 4,351,712 | 9/1982 | Cuomo et al. | 204/192 |
| 4,412,903 | 11/1983 | Green et al. | 204/192 C |
| 4,437,962 | 3/1984 | Banks | 204/192 |

*Primary Examiner*—Arthur P. Demers
*Attorney, Agent, or Firm*—Norman T. Musial; John R. Manning

[57] ABSTRACT

A diamondlike carbon film is deposited in the surface of a substrate by exposing the surface to an argon ion beam containing a hydrocarbon. The current density in the ion beam is low during initial deposition of the film.

Subsequent to this initial low current condition, the ion beam is increased to full power. At the same time a second argon ion beam is directed toward the surface of the substrate. The second ion beam has an energy level much greater than that of the ion beam containing the hydrocarbon. This addition of energy to the system increases mobility of the condensing atoms and serves to remove lesser bound atoms.

19 Claims, 1 Drawing Figure

U.S. Patent  Dec. 25, 1984  4,490,229
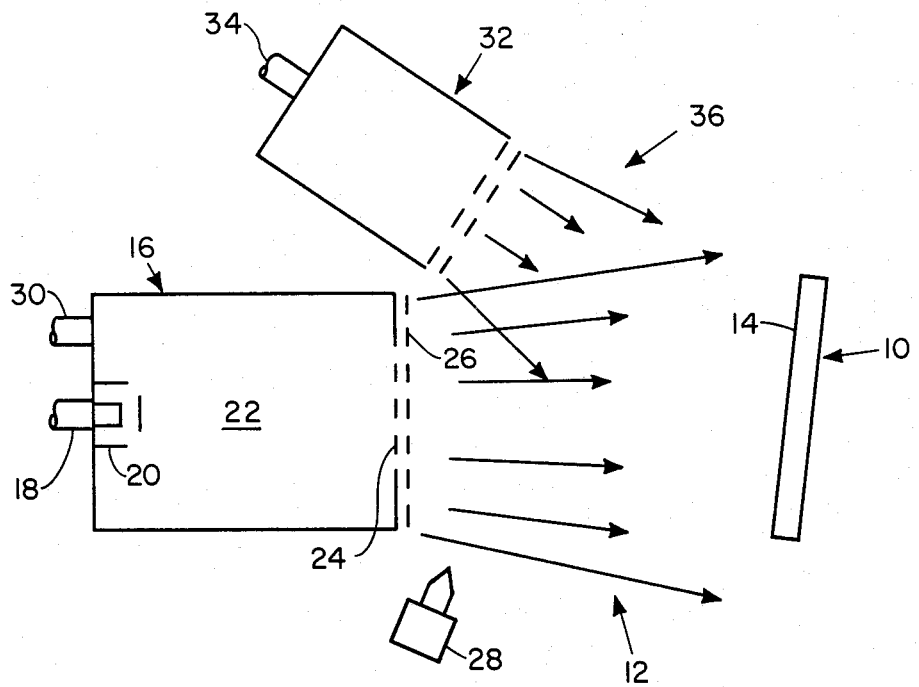

DEPOSITION OF DIAMONDLIKE CARBON FILMS

DESCRIPTION

ORIGIN OF THE INVENTION

The invention described herein was made by employees of the U.S. Government and may be manufactured and used by or for the Government for governmental purposes without the payment of any royalties thereon or therefor.

TECHNICAL FIELD

This invention is concerned with making thin films having the properties of diamond. The thicknesses of films are usually between thousands of angstroms and a few microns.

Various procedures have been utilized in an effort to produce carbon thin films with diamondlike properties. These films have numerous applications as scratch resistant coatings for polymers, weather resistant coatings, and biocompatable coatings on biomedical implants. A variety of plasma and ion beam techniques have been employed to produce such carbon films.

By way of example, rf plasma decomposition of hydrocarbon gas has been suggested. Such plasma decomposition of other alkanes has also been utilized, and low energy carbon ion beam deposition has been reported. Ion plating and dual ion techniques using a carbon target have also been used.

The quality of the films produced by the prior art methods is such that the films appear to have a low electrical resistivity of about 1 to 10 ohm cm and high optical absorption of about $10^5$ cm$^{-1}$. These films also have less resistance to chemical attack of $H_2SO_4/HNO_3$. The films are also softer than desired, and their densities are lower than optimum.

Another disadvantage to these prior art techniques is that the size of the substrate to be coated is limited. Also the deposition rates are undesirably low. The prior art is further deficient in that the films produced are stressed because of the inability to control enough independent parameters.

It is, therefore, an object of the present invention to provide thin carbon films having diamondlike properties which include extreme mechanical hardness characterized by high scratch resistance, high dielectric strength and electrical resistivity together with a large band gap, high thermal conductivity, chemical inertness including insolubility in concentrated $H_2SO_4/HNO_3$, and optical properties that include high transmittance at visible wavelengths.

BACKGROUND ART

Green et al U.S. Pat. No. 4,412,903 describes a diamondlike carbon coating deposited from methane in a direct current glow discharge process. The substrate may be precleaned with argon ion bombardment. Carlson et al U.S. Pat. No. 4,060,660 also refers to the deposition of an amorphous carbon thin-film in a glow discharge process.

Cuomo et al U.S. Pat. No. 4,351,712 is concerned with a low energy ion beam deposition/oxidation process. The deposition takes place at low energy levels from about 30 eV to about 180 eV. Banks U.S. Pat. No. 4,437,962 is directed to the production of diamondlike flakes which are mixed with a binder or matrix material to form composites.

DISCLOSURE OF INVENTION

This invention provides thin carbon films of superior quality having the properties of diamond. The films are generated by a deposition employing a hollow cathode with hydrocarbon/argon ion sources.

Low current densities are utilized during initial deposition of the film. The ions or charge-exchanged neutrals have energy levels between about 80 eV and about 150 eV. The flowrate ratio of methane to argon is about 28%.

The resulting films have a potential for use in microelectronic applications. These films are also used in high energy laser and plastic windows. It is further contemplated that the films may be utilized for corrosion protection for metal.

BRIEF DESCRIPTION OF THE DRAWING

The objects, advantages and novel features of the invention will be more fully apparent from the following description when read in connection with the accompanying drawing which is a schematic view of a dual beam ion source system utilized for the deposition of films having diamondlike properties.

BEST MODE FOR CARRYING OUT THE INVENTION

In referring now to the drawing there is shown a substrate 10 of quartz, silicon, or other metal upon which a diamondlike carbon film is generated. According to the present invention the substrate 10 is first exposed to an argon ion beam 12 to clean absorbed gasses and contaminants from the exposed surface 14. The beam 12 has an energy level between about 500 eV and about 1000 eV. The current density of the beam 12 is between about 0.5 ma/cm$^2$ to about 2 ma/cm$^2$.

The argon ion beam 12 is preferably generated by a 30 centimeter electron bombardment ion source 16 that is connected to a suitable reservoir of argon gas through a supply pipe 18. The argon gas is fed through a hollow cathode 20 into a main discharge chamber 22.

The ion beam source 16 may be of the type developed from electrical propulsion technology. Such an ion source is described in "Advances in Electronics and Electron Physics" by H. R. Kaufman, Vol. 36, pages 265–373, 1974. Liquid nitrogen is used in cold traps of diffusion pumps and the cryoliner of the vacuum system during operation of the ion source 16.

Beam extraction is accomplished by a dished, two grid ion optics system of the type described in AIAA Paper No. 76-1017 entitled "A 30 cm Diameter Argon Ion Source". This system includes an upstream grid 24 and a downstream grid 26. The 30-cm argon ion beam source preferably has its ion optics masked down to an ion beam diameter of about 10 cm.

Neutralization of the ion beam 12 may be achieved by a hot wire or hollow cathode neutralizer 28 which also uses argon gas. In addition, neutralization of the ion beam may be achieved by secondary electons released by ion bombardment of the walls of a vacuum facility (not shown) which houses the ion source 16.

This vacuum facility is sufficiently large to minimize back sputtered facility material from contaminating the material being ion bombarded. Such a facility having a diameter of about 1.5 meters and a length of about 7.3 meters has been satisfactory. The vacuum facility normally is maintained at a pressure of about $3 \times 10^{-5}$ torr during the operation of the ion source 16.

The 30 cm hollow cathode ion source 16 is then used to directly deposit a diamondlike carbon film on the surface 14. Argon gas is used in the hollow cathode 20 to establish and maintain a discharge. Methane ($CH_4$) or another hydrocarbon is introduced into the main discharge chamber 22 from a supply pipe 30 whereupon C, $CH_4$, $CH_n$, $C^+$, $(CH_n)^+$ molecules and ions are introduced into the beam 12 through the ion optics system 24. The ideal flowrate ratio of methane to argon required to generate a diamondlike carbon film on the surface 14 is 28%.

The energy level required of the beam 12 is between about 80 eV and 150 eV to generate the diamondlike carbon film on the surface 14. The optimum energy level of the beam 12 is 100 eV. With this energy level it is necessary to have a voltage of $-600$ volts on the downstream grid 26 to extract the beam 12.

A novel feature of the invention is the utilization of a second ion beam source 32 during this deposition as will be described below in greater detail. The source 32 is preferably an 8 centimeter electron bombardment ion source which is similar to the source 16. Argon is supplied to the source 32 through a supply pipe 34, and an argon in beam 36 is produced. Neutralization of this beam is achieved by the neutralizer 28 used to neutralize the 30 cm ion source beam 12. Only one neutralizer is required for the system.

An important requirement of the present invention is that in order to initiate the deposition of a diamondlike carbon film on the surface 14, it is necessary for the current density in the beam 12 to be low during initial deposition at the substrate 10. A typical value is ½ or less of the current density during full deposition. This required low current density is for a period of time varying from 3 minutes to 30 minutes, depending upon the substrate material.

Subsequent to this initial low current condition the 30 centimeter hollow cathode ion source 16 is set at full power current conditions. At the same time the 8 centimeter ion source 30 using argon ions at 200 eV to 500 eV is turned on with the current density at the substrate of 25 microamperes/cm². This addition of energy to the system increases mobility of the condensing atoms and serves to remove lesser bound atoms. Typical deposit rates at these conditions is between 70 and 80 angstroms per minute.

A number of advantages are realized using the method of the present invention. For example, thermal control of the substrate 10 to change stress levels in the film can be achieved. It is further contemplated that the films can be laser annealed during deposition.

Other gasses can be introduced at the substrate 10 to change the composition of the film to achieve a desired property. For example, the addition of hydrogen gas to the films on the surface 14 increases their transparency.

Biasing of the substrate 10 during deposition may be varied using either RF or DC. The angles of incidence of the energetic argon ion beam 34 or the low energy hydrocarbon ion beam 12 may be varied. It is further contemplated that the substrate may be rotated to coat complex geometric configurations. In certain applications the diameters of the ion sources 16 and 32 may be made larger or smaller than those presently described.

The advantages of the disclosed process over those of the prior art are that the films produced though amorphous are clear, extremely hard, chemically inert, of high resistivity and have an index of refraction of 3.2. These properties are similar to those of a single crystal diamond.

These films have uses in microelectronic applications, high energy laser and plastic windows, and corrosion protection for metal. This process has other applications where the desired properties the diamondlike film can be shaped, using the many independent parameters, during the film formation process.

Failure to follow the critical process steps of this invention may result in no film being deposited on the surface 14. In other instances the film may spall or it may be loosely bound carbon or soot.

The utilization of the hollow cathode ion source 16 with a mix of hydrocarbon gasses and argon operated at low energies for direct deposition of the film on the substrate 10, in addition to the use of a second ion source 30, provides an independent source of argon ions with various energies and current density levels. This independently controls the mobility of the condensing atoms and sputters away loosely bound atoms.

While the preferred embodiment of the invention has been disclosed and described it will be appreciated that various modifications may be made without departing from the spirit of the invention or the scope of the subjoined claims.

We claim:

1. A method of making diamondlike carbon films on a substrate comprising the steps of
    exposing said substrate to a first ion beam having a first current density and a first energy level,
    introducing a hydrocarbon into said first ion beam whereby an initial portion of a diamondlike carbon film is deposited on said substrate,
    increasing the current density of said first ion beam to a second current density whereby a remaining portion of a diamondlike carbon film is deposited on said substrate, and
    exposing said substrate to a second ion beam having a second energy level greater than said first energy level during the deposition of said remaining portion of said diamondlike carbon film.

2. A method of making a diamondlike carbon film as claimed in claim 1 wherein the substrate is mounted in a vacuum environment having a pressure of about $3 \times 10^{-5}$ torr.

3. A method of making a diamondlike carbon film as claimed in claim 1 wherein the first ion beam contains argon ions.

4. A method of making a diamondlike carbon film as claimed in claim 1 wherein the first current density of the first ion beam is less than one half the second current density of the first ion beam.

5. A method of making a diamondlike carbon film as claimed in claim 4 wherein the first current density is maintained for a period of time between about three minutes and about thirty minutes.

6. A method of making a diamondlike carbon film as claimed in claim 1 wherein the first energy level of the first ion beam is between about 80 eV and about 150 eV.

7. A method of making a diamondlike carbon film as claimed in claim 6 wherein the first energy level is about 100 eV.

8. A method of making a diamondlike carbon film as claimed in claim 6 wherein the second energy level of said second ion beam is between about 200 eV and about 500 eV.

9. A method of making a diamondlike carbon film as claimed in claim 1 wherein the current density of the second ion beam at the substrate is about 25 microamoperes/cm$^2$.

10. A method of depositing a diamondlike carbon film on a substrate surface comprising the steps of
mounting the substrate in a vacuum environment,
directing a first ion beam containing a hydrocarbon toward said surface, and
directing a second ion beam having an energy level greater than that of said first ion beam toward said surface.

11. A method of depositing a diamondlike carbon film as claimed in claim 10 wherein the substrate is mounted in a vacuum environment having a pressure of about $3\times10^{-5}$ torr.

12. A method of depositing a diamondlike carbon film as claimed in claim 10 wherein said first and second ion beams contain argon ions.

13. A method of depositing a diamondlike carbon film as claimed in claim 10 wherein the first ion beam has an energy level between about 80 eV and about 150 eV and the second ion beam has an energy level between about 200 eV and about 500 eV.

14. A method of depositing a diamondlike carbon film as claimed in claim 10 wherein the substrate is biased during film deposition.

15. A method of depositing a diamondlike carbon film as claimed in claim 10 wherein hydrogen gas is added to said film during deposition thereby increasing the transparency.

16. A method of depositing a diamondlike carbon film as claimed in claim 10 wherein the substrate is rotated during deposition.

17. A method of depositing a diamondlike carbon film as claimed in claim 10 wherein the film is annealed during deposition.

18. A method of depositing a diamondlike carbon film as claimed in claim 17 wherein the film is laser annealed.

19. A substrate having a diamondlike carbon film deposited thereon in accordance with the method of claim 1.

* * * * *